United States Patent
Fang et al.

(10) Patent No.: US 10,446,454 B2
(45) Date of Patent: Oct. 15, 2019

(54) SEMICONDUCTOR DEVICE PACKAGE STRUCTURE

(71) Applicant: Advanced Semiconductor Engineering, Inc., Kaohsiung (TW)

(72) Inventors: Yu-An Fang, Kaohsiung (TW); Ying-Chung Chen, Kaohsiung (TW); Cheng-Ling Huang, Kaohsiung (TW)

(73) Assignee: ADVANCED SEMICONDUCTOR ENGINEERING, INC., Kaohsiung (TW)

(*) Notice: Subject to any disclaimer, the term of this patent is extended or adjusted under 35 U.S.C. 154(b) by 0 days.

(21) Appl. No.: 15/351,241

(22) Filed: Nov. 14, 2016

(65) Prior Publication Data

US 2018/0138099 A1    May 17, 2018

(51) Int. Cl.
| | |
|---|---|
| H01L 23/053 | (2006.01) |
| H01L 23/10 | (2006.01) |
| B81B 7/00 | (2006.01) |
| B81C 1/00 | (2006.01) |
| H01L 23/04 | (2006.01) |
| H01L 21/683 | (2006.01) |

(52) U.S. Cl.
CPC .......... *H01L 23/053* (2013.01); *B81B 7/0032* (2013.01); *B81B 7/0061* (2013.01); *B81C 1/00269* (2013.01); *B81C 1/00309* (2013.01); *H01L 21/6836* (2013.01); *H01L 23/04* (2013.01); *H01L 23/10* (2013.01); *H01L 2221/68331* (2013.01)

(58) Field of Classification Search
CPC ... B81B 7/0061; B81B 7/0067; B81B 7/0038; B81B 7/0051; B81C 1/00309
See application file for complete search history.

(56) References Cited

U.S. PATENT DOCUMENTS

| | | | |
|---|---|---|---|
| 5,612,576 A | 3/1997 | Wilson et al. | |
| 5,893,726 A * | 4/1999 | Farnworth | H01L 23/04 257/E23.181 |
| 7,833,894 B2 | 11/2010 | Hiatt | |
| 8,853,839 B2 | 10/2014 | Gao et al. | |
| 8,946,620 B2 | 2/2015 | Loong et al. | |
| 9,475,691 B1 * | 10/2016 | Chua | B81B 7/0064 |
| 2003/0056392 A1 * | 3/2003 | Boroson | H01L 23/10 34/335 |
| 2005/0263324 A1 | 12/2005 | Wong et al. | |
| 2008/0150129 A1 * | 6/2008 | Yasooka | H01L 23/10 257/728 |
| 2014/0061883 A1 * | 3/2014 | Bowles | H01L 23/10 257/676 |
| 2014/0103518 A1 * | 4/2014 | Fu | H01L 23/49861 257/704 |
| 2015/0237431 A1 * | 8/2015 | Jeziorek | H04R 1/086 381/361 |

* cited by examiner

*Primary Examiner* — Erik Kielin
(74) *Attorney, Agent, or Firm* — Foley & Lardner LLP; Cliff Z. Liu

(57) ABSTRACT

A semiconductor device package comprises a carrier having a through hole. A lid is over the carrier and comprises a first side wall, a second side wall, and a connection wall. The second side wall is opposite the first side wall, and the connection wall is between the first side wall and the second side wall. The lid and the carrier form a plurality of chambers. The first side wall, the second side wall and the connection wall form a space to fluidly connect the plurality of chambers.

23 Claims, 7 Drawing Sheets

SEMICONDUCTOR DEVICE PACKAGE STRUCTURE

BACKGROUND

1. Technical Field

The present disclosure relates to a semiconductor device package structure. In particular, the present disclosure relates to a semiconductor device package structure which avoids degradation resulting from thermal cycling.

2. Description of the Related Art

In a process of packaging semiconductor devices, a lid is used to protect a die and other electronic devices on a substrate from moisture, dust, particles, or the like. The lid is glued to the substrate to form a semiconductor device package. However, the lid may be detached from the substrate due to expansion of trapped air or other fluid resulting from thermal cycling (e.g., a semiconductor package may be heated to cure the glue between the lid and the substrate). This effect is referred to as a "pop-corn" effect.

It is against this background that a need arose to develop the package structures and related methods described herein.

SUMMARY

An aspect of the present disclosure relates to a semiconductor device package. In some embodiments, the semiconductor device package includes a carrier having a through hole, and a lid over the carrier. The lid includes a first side wall, a second side wall opposite the first side wall, and a connection wall extending between the first side wall and the second side wall. The lid and the carrier form a plurality of chambers. The first side wall, the second side wall and the connection wall form a space to fluidly connect the plurality of chambers.

Another aspect of the present disclosure relates to a semiconductor device package. In some embodiments, the semiconductor device package includes a carrier having a through hole, a lid over the carrier, a first electronic component, and a second electronic component. The lid includes a first side wall, a second side wall opposite the first side wall, a third side wall extending between the first side wall and the second side wall, a fourth side wall opposite the third side wall and extending between the first side wall and the second side wall, and a connection wall disposed between the third side wall and the fourth side wall and extending between the first side wall and the second side wall. The first side wall, the second side wall, the third side wall, the connection wall, and the carrier form a first chamber. The first side wall, the second side wall, the fourth side wall, the connection wall, and the carrier form a second chamber. The first side wall, the second side wall and the connection wall form a space to fluidly connect the first chamber and the second chamber. The first electronic component is in the first chamber, and the second electronic component is in the second chamber.

Another aspect of the present disclosure relates to a semiconductor device package. In some embodiments, the semiconductor device package includes a carrier having a through hole, a lid over the carrier, a first electronic component, and a second electronic component. The lid includes a first side wall, a second side wall opposite the first side wall, and a connection wall extending between the first side wall and the second side wall. The lid and the carrier form a first chamber and a second chamber separated from the first chamber by the connection wall, and the through hole extends into the first chamber. The first electronic component is in the first chamber, and the second electronic component is in the second chamber. The first side wall, the second side wall and the connection wall form a space to fluidly connect the first chamber and the second chamber.

BRIEF DESCRIPTION OF THE DRAWINGS

Common reference numerals are used throughout the drawings and the detailed description to indicate the same or similar elements. Embodiments of the present disclosure will be more apparent from the following detailed description taken in conjunction with the accompanying drawings.

DETAILED DESCRIPTION

Spatial descriptions, such as "above," "below," "up," "left," "right," "down," "top," "bottom," "vertical," "horizontal," "side," "higher," "lower," "upper," "over," "under," and so forth, are specified with respect to a certain component or group of components, or a certain plane of a component or group of components, for the orientation of the component(s) as shown in the associated figure. It should be understood that the spatial descriptions used herein are for purposes of illustration only, and that practical implementations of the structures described herein can be spatially arranged in any orientation or manner, provided that the merits of embodiments of this disclosure are not deviated by such arrangement.

Figure 1A:
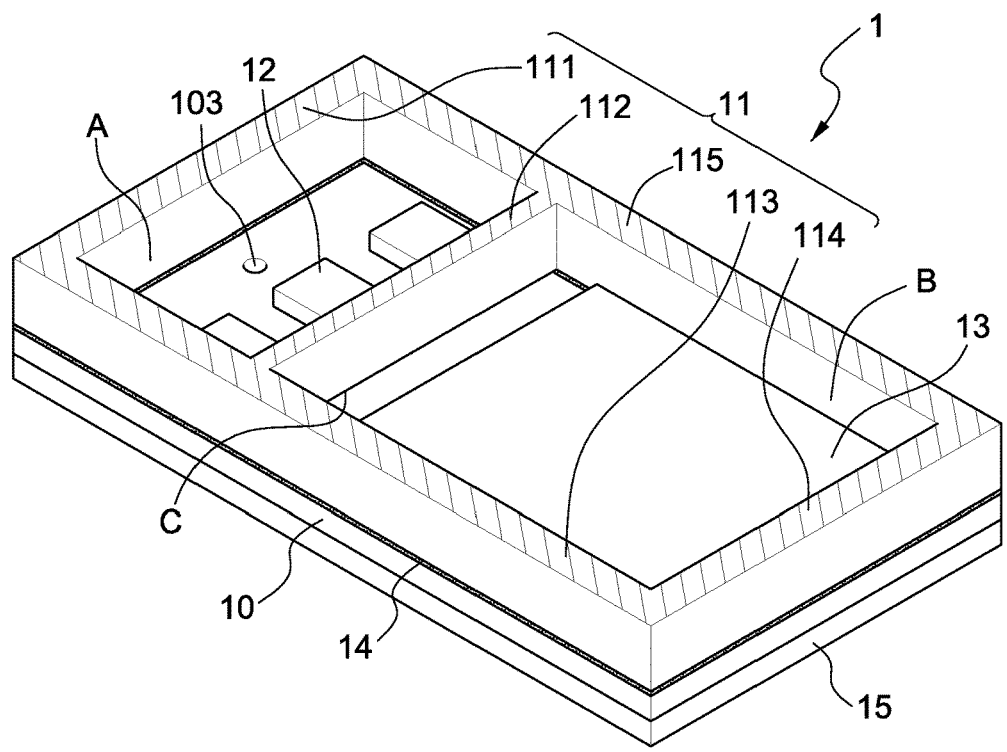
FIG. 1A is a perspective view of a semiconductor device package according to some embodiments of the present disclosure.

FIG. 1A is a perspective view of a semiconductor device package 1 according to some embodiments of the present disclosure. The semiconductor device package 1 includes a carrier 10, a lid 11, dies 12 and 13, a solder mask layer 15, chambers A and B, and space C.

The carrier 10 has or defines a through hole 103. The carrier 10 may include a semiconductor material, glass, a polymer (e.g., polypropylene (PP)), a resin (e.g., bismaleimide-triazine (BT) resin or a glass-reinforced epoxy resin like FR-4 resin) or another suitable material to support components thereon. Although not illustrated in FIG. 1A, it is contemplated that the carrier 10 may include one or more redistribution structures, which may include conductive traces, vias, and pads.

The lid 11 includes side walls 111, 113, 114, and 115 and a connection wall 112. The side wall 111 is opposite to the side wall 114. The side wall 113 is opposite to the side wall 115. The connection wall 112 is connected between the side wall 113 and the side wall 115. The side wall 113 extends between the side wall 111 and the side wall 114, and the side wall 115 extends between the side wall 111 and the side wall 114.

The carrier 10 and parts of the lid 11 define the chamber A. The carrier 10, the side walls 111, 113, and 115 and the connection wall 112 define the chamber A. A space enclosed by the side walls 111, 113, 114 and 115 is divided or separated into the chamber A and the chamber B by the connection wall 112.

The carrier 10 and parts of the lid 11 define the chamber B. The carrier 10, the side walls 113, 114, and 115 and the connection wall 112 define the chamber B.

The carrier 10, the side walls 113 and 115 and the connection wall 112 define the space C. The connection wall 112 between the side wall 113 and the side wall 115 is separated from an upper surface 102 of the carrier 10 by the space C (see FIG. 1C). The chambers A and B may be fluidly connected with one another through the space C.

The dies 12 may include light emitting diodes (LEDs), pressure sensors or other semiconductor devices. The dies 12 may include a flip-chip type semiconductor device. The dies 12 may include a wire-bond type semiconductor device.

The die 13 may include an application-specific integrated circuit (ASIC), a controller, a processor or other electronic component or semiconductor device.

Figure 1B:
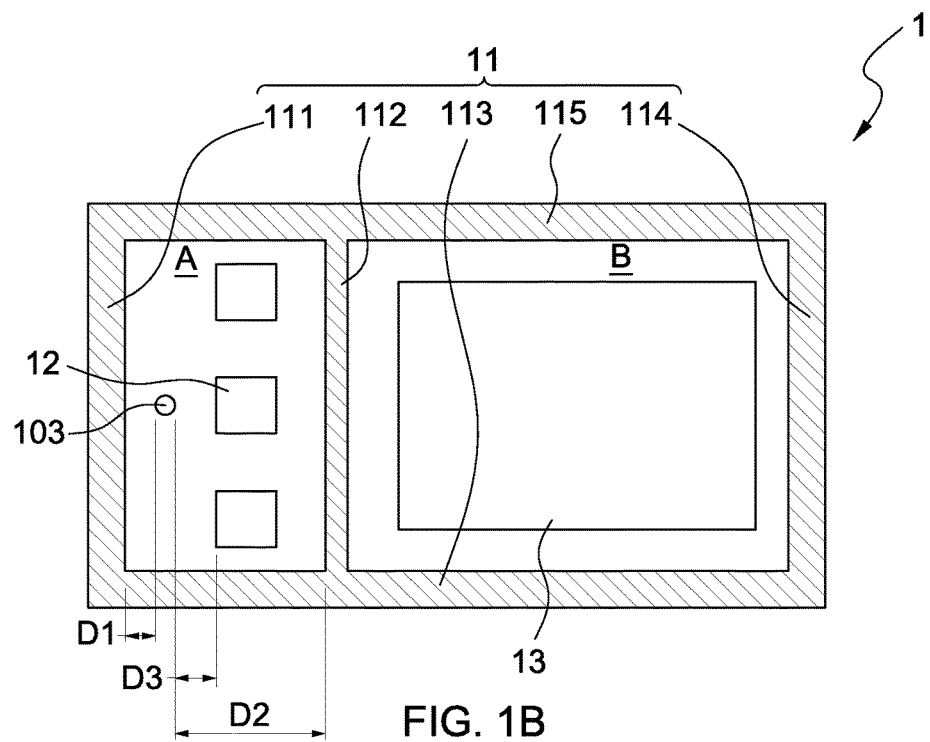
FIG. 1B is a top view of a semiconductor device package according to some embodiments of the present disclosure.
Figure 1C:
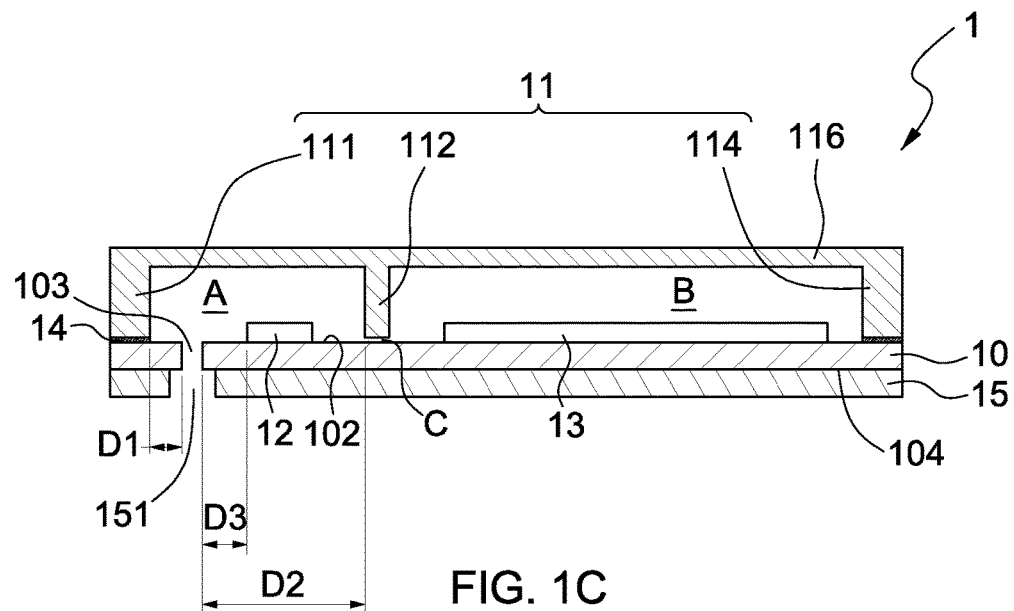
FIG. 1C is a cross-sectional view of a semiconductor device package according to some embodiments of the present disclosure.

The solder mask layer 15 is disposed on a lower surface 104 of the carrier 10 (see FIG. 1C). The surface 104 is opposite to the upper surface 102 of the carrier 10. The solder mask layer 15 may include a polymer or other suitable dielectric or insulating materials.

FIG. 1B is a top view of the semiconductor device package 1 according to some embodiments of the present disclosure. The through hole 103 may be formed by a photolithography technique, laser drilling, mechanical drilling or another suitable technique. A size (e.g., a diameter) of the through hole 103 may be from approximately 80 micrometer (μm) to approximately 200 μm.

The through hole 103 is disposed adjacent to the dies 12 on the carrier 10. The through hole 103 is disposed within the carrier 10 under the chamber A and extends into the chamber A. It is contemplated that the through 103 may be disposed within the carrier 10 under the chamber B. It is contemplated that the through 103 may be disposed within the carrier 10 under the space C.

The through hole 103 is spaced away from a bottom of the lid 11 by a distance to prevent an adhesive 14 from flowing into the through hole 103. The through hole 103 is spaced away from the side wall 111 by a distance D1 from approximately 200 μm to approximately 300 μm. The through hole 103 is spaced away from the connection wall 112 by a distance D2 from approximately 360 μm to approximately 460 μm. The through hole 103 is spaced away from the die 12 by a distance D3 from approximately 200 μm to approximately 300 μm. In some embodiments, the through hole 103 is spaced closer to the side wall 111 than the connection wall 112, such that D1 is smaller than D2. In some embodiments, the through hole 103 is spaced away from a bonding pad (not shown in FIG. 1A or FIG. 1B) by a distance from approximately 150 μm to approximately 250 μm. In some embodiments, the through hole 103 is spaced away from a land grid array (LGA) pin (also not shown in FIG. 1A or FIG. 1B) by a distance from approximately 150 μm to approximately 250 μm. Distances D1, D2, and D3 may be varied in accordance with a circuitry layout on and within the carrier 10.

In some embodiments, the through hole 103 may be formed at other locations within the chamber A under the design rule for the distances D1 to D3. For example, the through hole 103 may be formed at a location between the side wall 113 and die 12 or a location between the side wall 115 and die 12, and a distance between the through hole 103 and the side wall 113/115 may be from approximately 200 μm to approximately 300 μm. If one of the other locations cannot meet the specification of the design rule for the distances D1 to D3, the through hole 103 may not be formed at the other location. In some embodiments, if there is no adhesive under the connection wall 112, the through hole 103 may be formed under the connection wall 112 or formed between the connection wall 112 and the die 12. In this case, the distance D2 is less than approximately 360 μm. The distance D2 may be zero when the through hole 103 is formed under the connection wall 112. In other embodiments, it is contemplated that more than one through hole 103 may be disposed under the chamber A. It is contemplated that the through hole 103 may be disposed under the chamber B.

The through hole 103 may be disposed adjacent to the die 13 on the carrier 10. In some embodiments, the through hole 103 may be formed at a location within the chamber B under the design rule for the distances D1 to D3. For example, the through hole 103 may be formed at a location between the side wall 113 and the die 13 or a location between the side wall 115 and the die 13. In some embodiments, if there is no adhesive under the connection wall 112, the through hole 103 may be formed under the connection wall 112 or formed between the connection wall 112 and the die 13. In some embodiments, one of at least two through holes 103 may be disposed within the chamber A and another one may be disposed within the chamber B.

FIG. 1C is a cross-sectional view of the semiconductor device package 1 according to some embodiments of the present disclosure. The solder mask layer 15 may include one or more openings 151. A size of the solder mask opening 151 may be from approximately 200 μm to approximately 300 μm. The size of the solder mask opening 151 is greater than the size of the through hole 103 by approximately 100 μm. The opening 151 is aligned with the through hole 103. The opening 151 may have a shift tolerance of ±50 μm. As shown in FIG. 1C, the through hole 103 extends from the upper surface 102 of the carrier 10 to the lower surface 104 of the carrier 10.

The side walls 111, 113, 114, and 115, the connection wall 112, and an upper portion 116 of the lid 11 of the semiconductor device package 1 are integrally formed in some embodiments. A height of each of the side walls 111, 113, 114, and 115 is substantially the same as that of the connection wall 112. The adhesive 14 is disposed between a bottom of each of the side walls 111, 113, 114, and 115 of the lid 11 and the carrier 10. The adhesive 14 is absent under the connection wall 112. The adhesive 14 may be cured to securely connect the carrier 10 and the lid 11. The chamber A is formed by the side walls 111, 113, and 115, the connection wall 112, and the carrier 10. The dies 12 are disposed within the chamber A and on the surface 102 of the carrier 10. The die 13 is disposed within the chamber B and on the surface 102 of the carrier 10. The space C may communicate fluid or air between the chambers A and B. During thermal cycling, air pressure may be expelled from the through hole 103. The through hole 103 formed in the carrier 10 expels air from the chambers A and B so as to prevent the pop-corn effect. The designed distances D1, D2, and D3 may avoid the adhesive 14 from bleeding into the through hole 103.

Figure 1D:
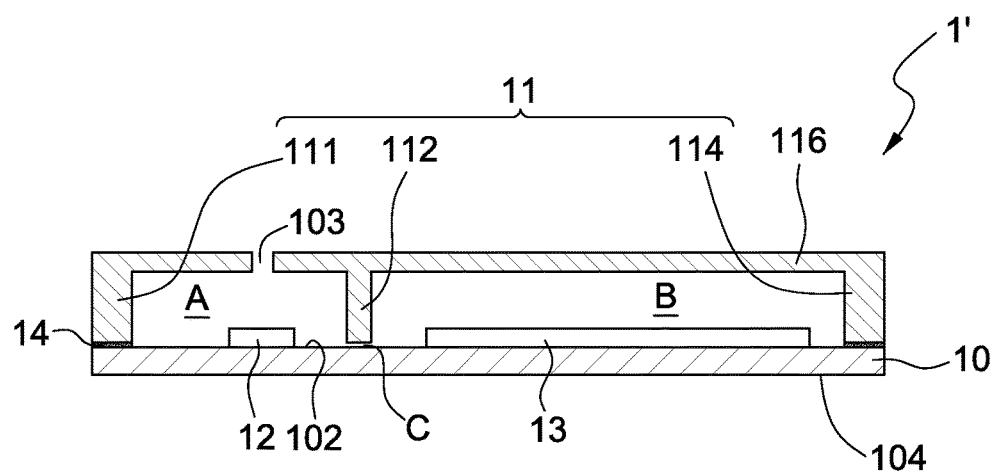
FIG. 1D is a cross-sectional view of a semiconductor device package according to some embodiments of the present disclosure.

FIG. 1D is a cross-sectional view of the semiconductor device package 1' according to some embodiments of the present disclosure. The semiconductor device package 1' is similar to the semiconductor device package 1 as illustrated and described with reference to FIG. 1C, except that the through hole 103 is formed in the upper portion 116 of the lid 11. The through hole 103 may be arranged over the chamber A. The through hole 103 may be arranged over the chamber A rather than chamber B such that light from the LED die 12 passes through the through hole 103 but not enter the chamber B. The through hole 103 may be over the LED die 12. Although it is not illustrated in FIG. 1D, it is contemplated that the through hole 103 may be arranged over the chamber B. The through hole 103 is not arranged directly above the die 13.

Figure 1E:
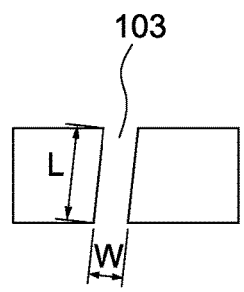
FIG. 1E is a top view of a portion of the lid of a semiconductor device package according to some embodiments of the present disclosure.

FIG. 1E is a top view of a portion of the lid 11 of a semiconductor device 1 package according to some embodiments of the present disclosure. In FIG. 1E, the shape of the through hole 103 is briefly shown as an inclined structure. The design of the inclined structure may reduce crosstalk.

Figure 2A:
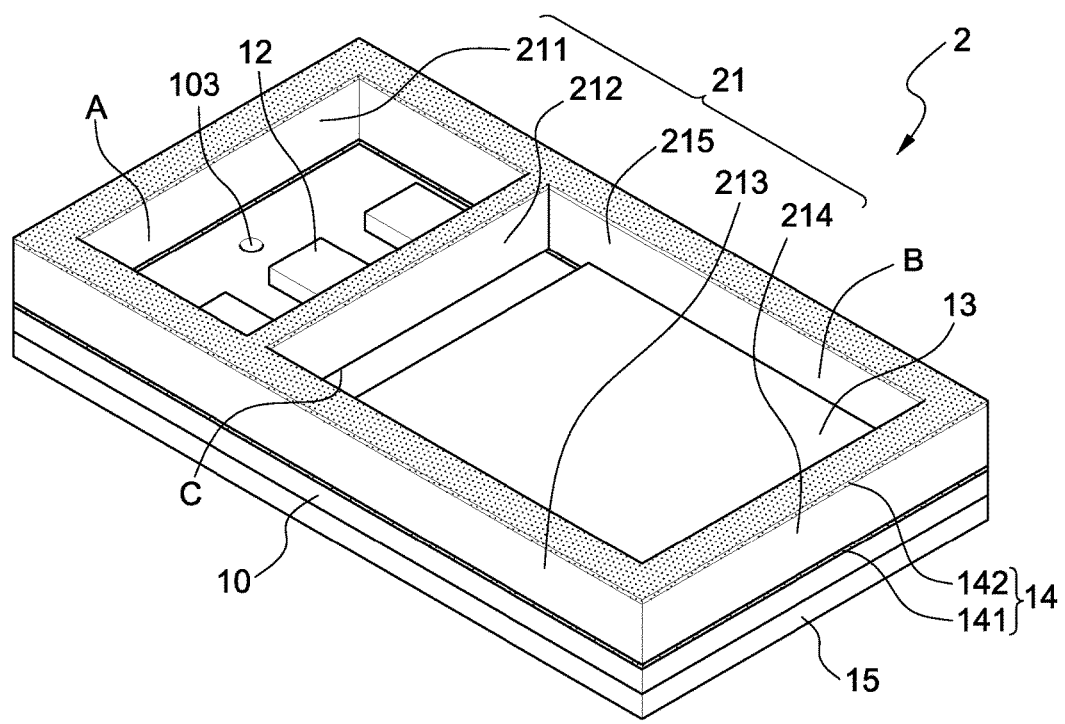
FIG. 2A is a perspective view of a semiconductor device package according to some embodiments of the present disclosure.

FIG. 2A is a perspective view of a semiconductor device package 2 according to some embodiments of the present disclosure. Similar to FIG. 1A, the semiconductor device package 2 includes a carrier 10, a lid 21, dies 12 and a die 13, a solder mask layer 15, chambers A and B, and space C.

The carrier 10 has or defines a through hole 103. The lid 21 includes side walls 211, 213, 214, and 215 and a connection wall 212. The side wall 211 is opposite to the side wall 214. The side wall 213 is opposite to the side wall 215. The connection wall 212 is connected between the side wall 213 and the side wall 215. The side wall 213 extends between the side wall 211 and the side wall 214, and the side wall 215 extends between the side wall 211 and the side wall 214.

The carrier 10 and parts of the lid 21 define the chamber A. The carrier 10, the side walls 211, 213, and 215 and the connection wall 212 define the chamber A. A space enclosed by the side walls 211, 213, 214 and 215 is divided or separated into the chamber A and the chamber B by the connection wall 212.

The carrier 10 and parts of the lid 21 define the chamber B. The carrier 10, the side walls 213, 214, and 215 and the connection wall 212 define the chamber B.

The carrier 10, the side walls 213 and 215 and the connection wall 212 define the space C. The connection wall 212 between the side wall 213 and the side wall 215 is separated from an upper surface 102 of the carrier 10 by the space C (see FIG. 2C).

Figure 2B:
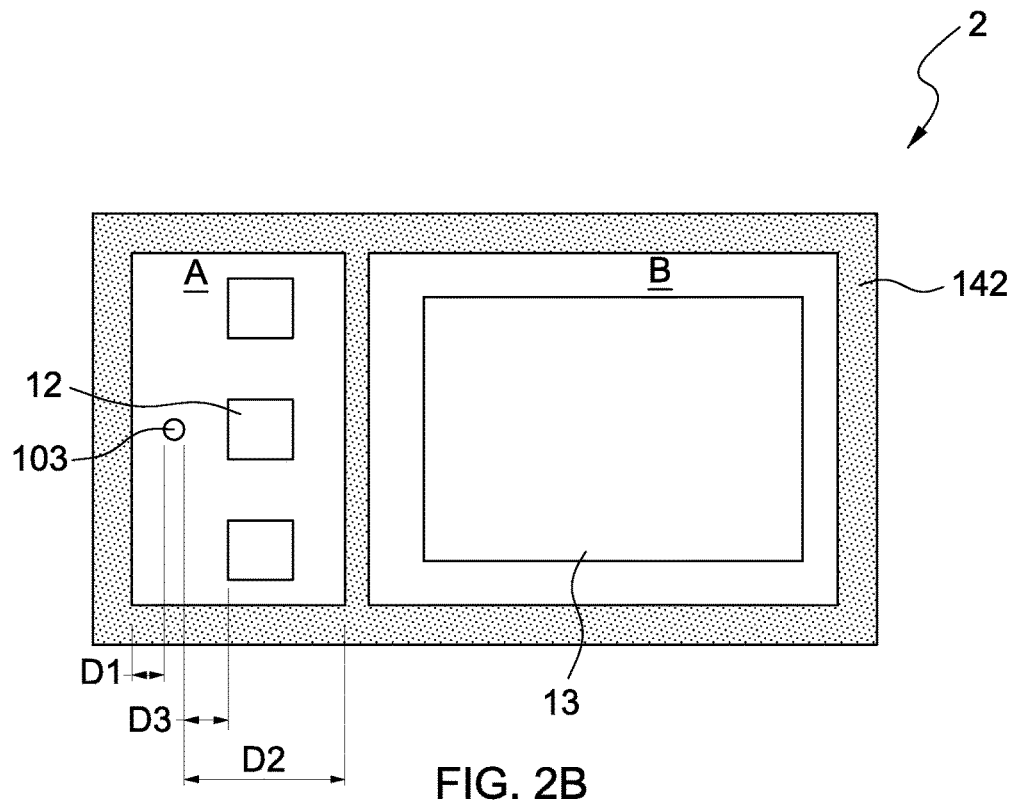
FIG. 2B is a top view of a semiconductor device package according to some embodiments of the present disclosure.

FIG. 2B is a top view of the semiconductor device package 2 according to some embodiments of the present disclosure. The through hole 103 may be formed by a photolithography technique, laser drilling, mechanical drilling or another suitable technique. A size (e.g., a diameter) of the through hole 103 may be from approximately 80 μm to approximately 200 μm.

The through hole 103 may be disposed adjacent to the dies 12 on the carrier 10. The through hole 103 is disposed within the carrier 10 under the chamber A. It is contemplated that the through 103 may be disposed within the carrier 10 under the chamber B. It is contemplated that the through 103 may be disposed within the carrier 10 under the space C.

The through hole 103 is spaced away from a bottom of the lid 21 by a distance to prevent an adhesive 14 from flowing into the through hole 103. The through hole 103 is spaced away from the side wall 211 by a distance D1 from approximately 200 μm to approximately 300 μm. The through hole 103 is spaced away from the connection wall 212 by a distance D2 from approximately 360 μm to approximately 460 μm. The through hole 103 is spaced away from the die 12 by a distance D3 from approximately 200 μm to approximately 300 μm. In some embodiments, the through hole 103 is spaced away from a bonding pad (not shown in FIG. 2A or FIG. 2B) by a distance from approximately 150 μm to approximately 250 μm. In some embodiments, the through hole 103 is spaced away from an LGA pin (also not shown in FIG. 2A or FIG. 2B) by a distance from approximately 150 μm to approximately 250 μm. Distances D1, D2, and D3 may be varied in accordance with the circuitry layout on and within the carrier 10.

In some embodiments, the through hole 103 may be formed at other locations within the chamber A under the design rule for the distances D1 to D3. For example, the through hole 103 may be formed at a location between the side wall 213 and the die 12 or a location between the side wall 215 and the die 12, and a distance between the through hole 103 and the side wall 213/215 may be from approximately 200 μm to approximately 300 μm. If one of the other locations cannot meet the specification of the design rule for the distances D1 to D3, the through hole 103 may not be formed at the other location. In some embodiments, if there is no adhesive under the connection wall 212, the through hole 103 may be formed under the connection wall 212 or formed between the connection wall 212 and the die 12. In this case, the distance D2 is less than approximately 360 μm. The distance D2 may be zero when the through hole 103 is formed under the connection wall 212. In some embodiments, it is contemplated that more than one through hole 103 may be disposed under the chamber A. It is contemplated that the through hole 103 may be disposed under the chamber B.

The through hole 103 may be disposed adjacent to the die 13 on the carrier 10. In some embodiments, the through hole 103 may be formed at a location within the chamber B under the design rule for the distances D1 to D3. For example, the through hole 103 may be formed at a location between the side wall 213 and the die 13 or a location between the side wall 215 and the die 13. In some embodiments, if there is no adhesive under the connection wall 212, the through hole 103 may be formed under the connection wall 212 or formed between the connection wall 212 and the die 13. In some embodiments, one of at least two through holes may be disposed within the chamber A and another one may be disposed within the chamber B.

Figure 2C:
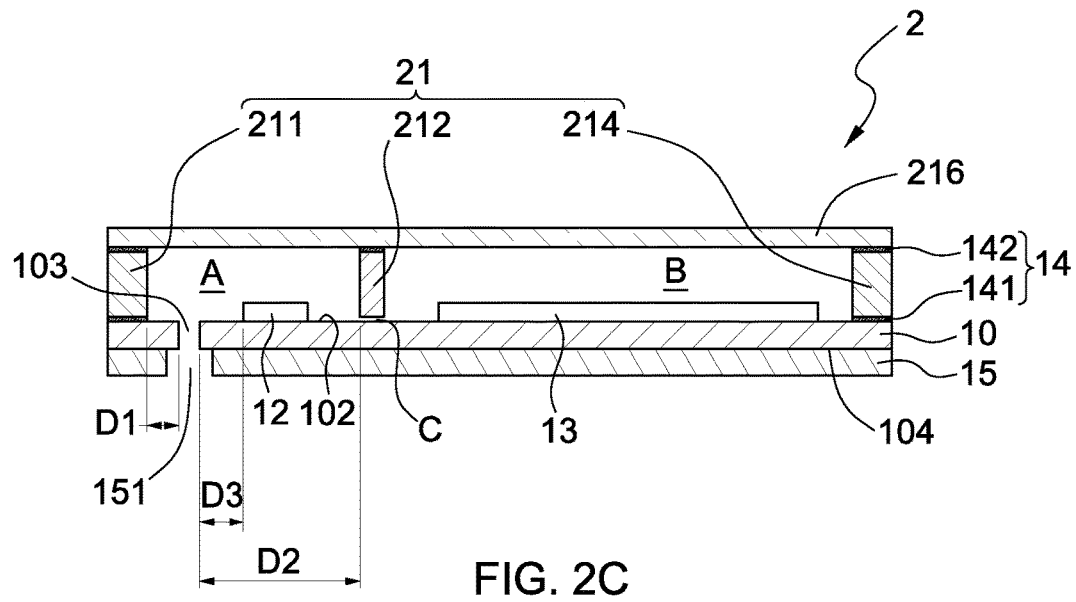
FIG. 2C is a cross-sectional view of a semiconductor device package according to some embodiments of the present disclosure.

FIG. 2C is a cross-sectional view of the semiconductor device package 2 according to some embodiments of the present disclosure. The solder mask layer 15 may include at least one opening 151 aligned with the through hole 103. A size of the solder mask opening 151 may be from approximately 200 μm to approximately 300 μm. The size of the solder mask opening 151 is greater than the size of the through hole 103 by approximately 100 μm. The opening 151 may have a shift tolerance of ±50 μm.

The lid 21 includes the side walls 211, 213, 214, and 215, the connection wall 212, and a top transparent plate 216. A height of each of the side walls 211, 213, 214, and 215 is substantially the same as that of the connection wall 212. The adhesive 14 includes adhesives 141 and 142. The transparent plate 216 is attached to the side walls 211, 213, 214, and 215 and the connection wall 212 by the adhesive 142. The side walls 211, 213, 214, and 215 are attached to the upper surface 102 of the carrier 10 by the adhesive 141. The adhesive 14 is absent under the connection wall 212. The adhesive 141 may be cured to securely connect the carrier 10 to the side walls 211, 213, 214, and 215 of the lid 21. The adhesive 142 may be cured to securely connect the transparent plate 216 to the side walls 211, 213, 214, and 215 and the connection wall 212 of the lid 21. The space C may communicate fluid or air between the chambers A and B. During thermal cycling, air pressure may be expelled from the through hole 103. The through hole 103 formed in the carrier 10 expels air from the chambers A and B so as to prevent the pop-corn effect. The designed distances D1, D2, and D3 may avoid the adhesive 141 from bleeding into the through hole 103.

Figure 3A:
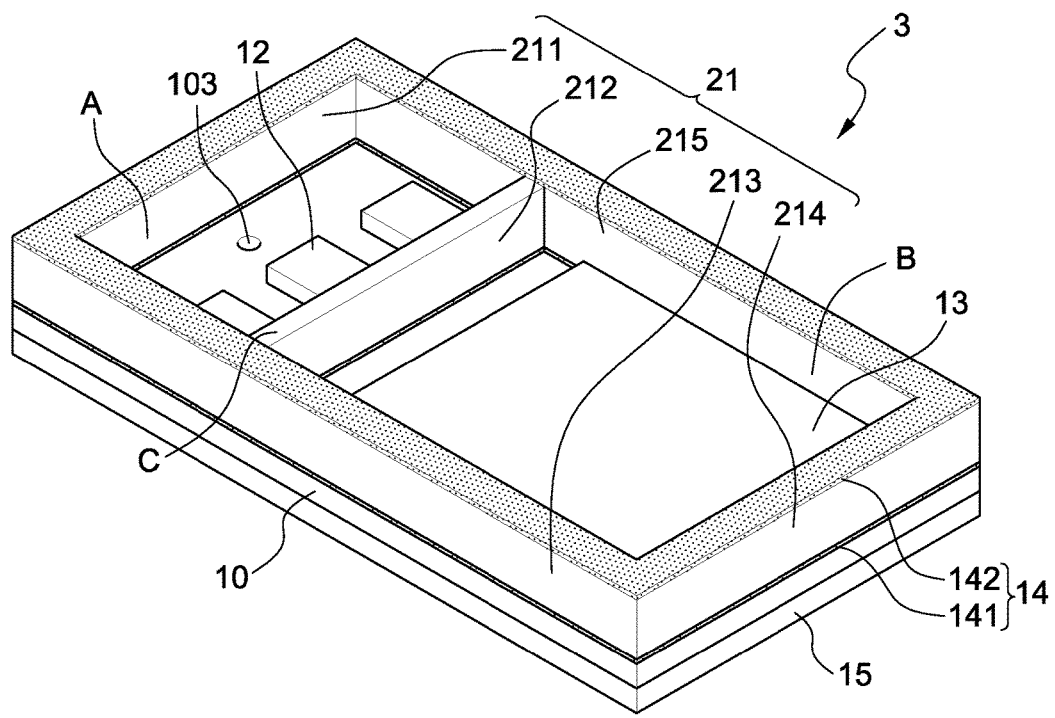
FIG. 3A is a perspective view of a semiconductor device package according to some embodiments of the present disclosure.

FIG. 3A is a perspective view of a semiconductor device package 3 according to some embodiments of the present disclosure. The semiconductor device package 3 is similar to the semiconductor device package 2 as illustrated and described with reference to FIG. 2A, except that the adhesive 142 between the connection wall 212 and the transparent plate 216 is omitted and the adhesive 141 is disposed between the connection wall 212 and the carrier 10.

Figure 3B:
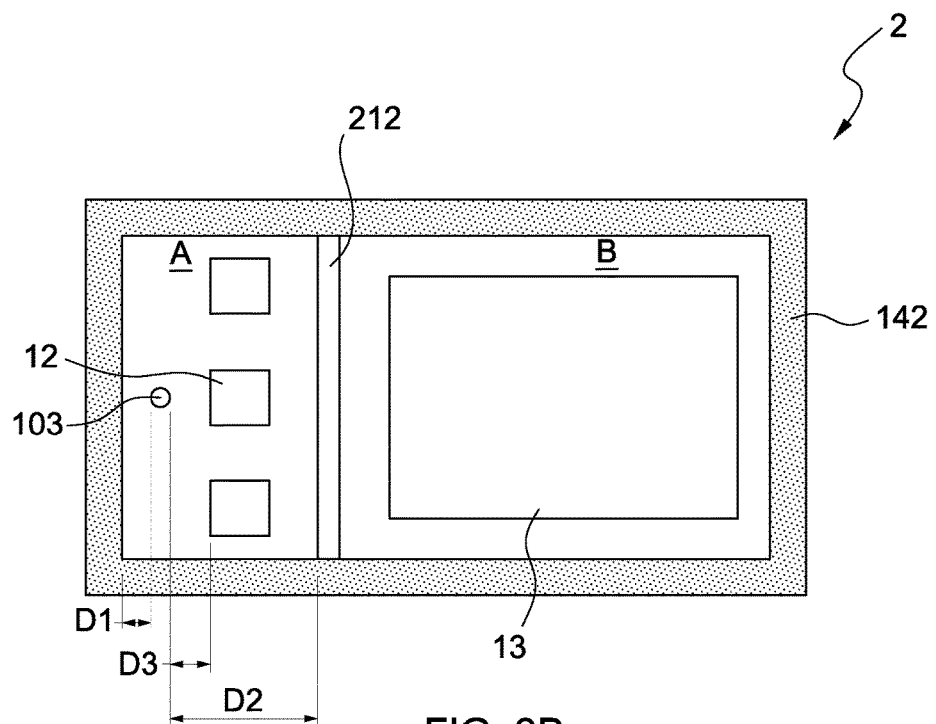
FIG. 3B is a top view of a semiconductor device package according to some embodiments of the present disclosure.

FIG. 3B is a top view of the semiconductor device package 3 according to some embodiments of the present disclosure. The through hole 103 may be formed by a photolithography technique, laser drilling, mechanical drilling or another suitable technique. A size (e.g., a diameter) of the through hole 103 may be from approximately 80 μm to approximately 200 μm.

Figure 3C:
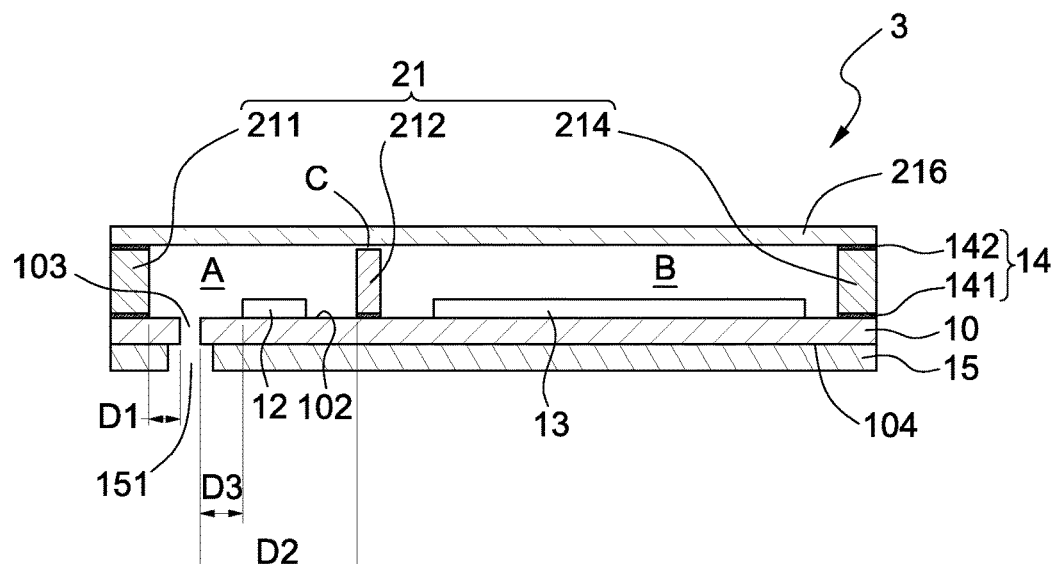
FIG. 3C is a cross-sectional view of a semiconductor device package according to some embodiments of the present disclosure.

FIG. 3C illustrates a cross-sectional view of the semiconductor device package 3 according to some embodiments of the present disclosure. The semiconductor device package 3 is similar to the semiconductor device package 2 as illustrated and described with reference to FIG. 2C, except that the adhesive 142 between the connection wall 212 and the transparent plate 216 is omitted and the adhesive 141 is disposed between the connection wall 212 and the carrier 10. The space C is defined by the transparent plate 216, the connection wall 212, and the side walls 213 and 215 (see FIG. 3A). The connection wall 212 between the side wall 213 and the side wall 215 is separated from a bottom surface of the transparent plate 216 by the space C. The space C may communicate fluid or air between the chambers A and B. The designed distances D1, D2, and D3 may avoiding the adhesive 141 from bleeding into the through hole 103. A size of a solder mask opening 151 may be from approximately 200 μm to approximately 300 μm.

Figure 4A:
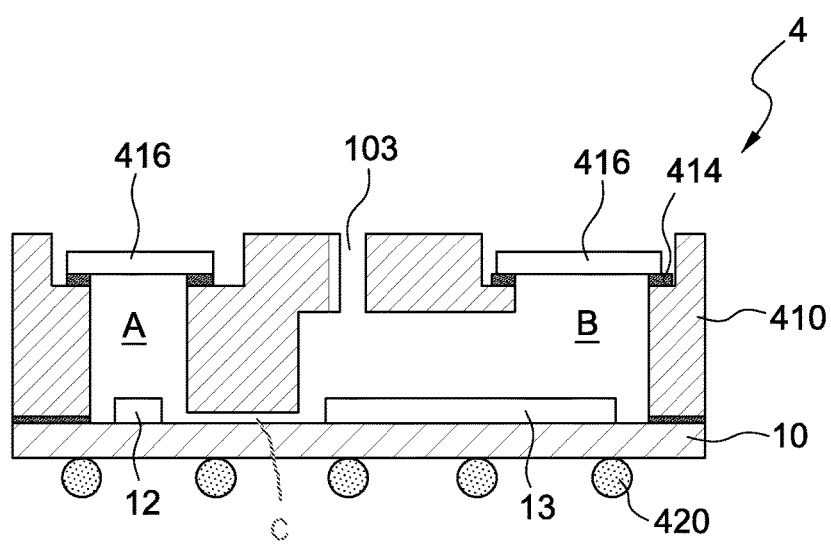
FIG. 4A is a cross-sectional view of a semiconductor device package according to some embodiments of the present disclosure.

FIG. 4A illustrates a cross-sectional view of the semiconductor device package 4 according to some embodiments of the present disclosure. The semiconductor device package 4 includes a carrier 10, a lid 410, dies 12 and 13, solder balls 420, chambers A and B, and space C.

The lid 410 includes multiple recesses and a through hole 103. The top view of the structure of the through hole 103 may be the same as that shown in FIG. 1E. The lid 410 includes transparent plates 416. The transparent plates 416 are correspondingly attached in the recesses through adhesive 414. The thickness of the transparent plate 416 is not greater than the height of the recess. The top surface of the transparent plate 416 is lower than the top surface of the lid 410.

In one embodiment, the die 12 may be an emitter. The die 13 may be a sensor. The emitter may transmit light passing through the corresponding transparent plate 416. The sensor may sense the force pressed on the corresponding transparent plate 416. The through hole 103 is defined in the upper portion of the lid 410. The through hole 103 may be arranged on a portion of the upper portion of the lid 410 corresponding to the chamber B. During the heating operation, air will be expanded which results in the pressure in the chambers. The heated air may be exhausted via the through hole 103 and the "pop-corn" effect may be avoided.

Figure 4B:
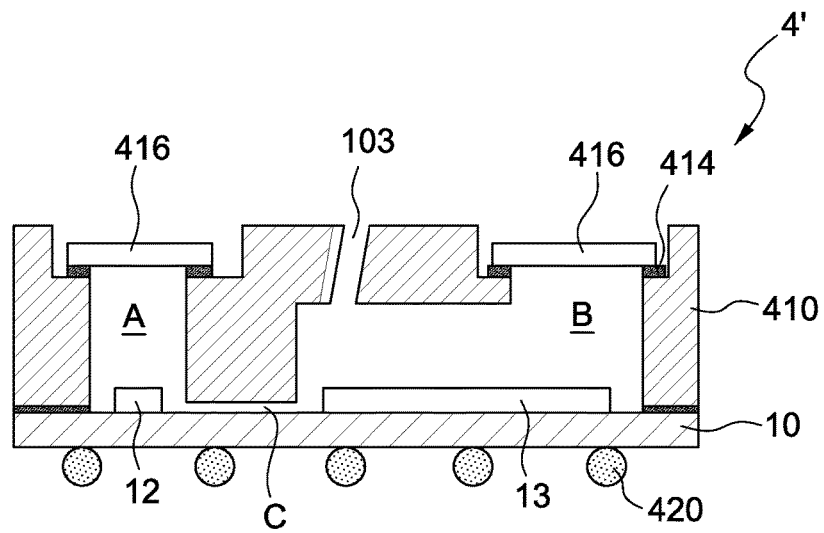
FIG. 4B is a cross-sectional view of a semiconductor device package according to some embodiments of the present disclosure.

FIG. 4B is a cross-sectional view of the semiconductor device package 4' according to some embodiments of the present disclosure. Similar to the structure of FIG. 4A, the difference between FIGS. 4A and 4B is that the cross-section of the through hole 103 has an inclined structure. The design of the through hole 103 may prevent the collimated light from directly passing to the chamber B.

Figure 5:
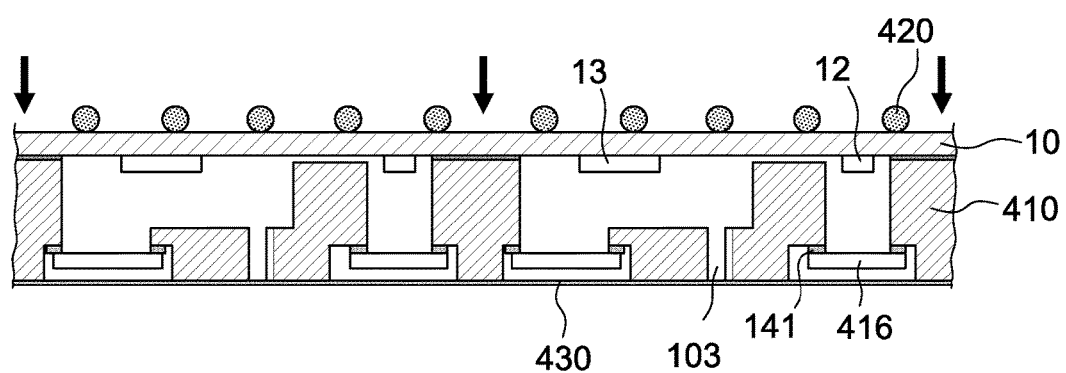
FIG. 5 is a singulation operation of a semiconductor device package according to some embodiments of the present disclosure.

FIG. 5 is a singulation operation of semiconductor device packages according to some embodiments of the present disclosure. A strip or matrix of semiconductor device packages are provided. A tape 430 is attached to the top surface of the semiconductor device packages to seal the through holes 103 in the lids 410 so as to prevent water (which may be used during the singulation operation) from flowing into the semiconductor device packages. The singulation operation is performed by using backside saws. After the completion of the singulation operation, the tape 430 is removed to form a plurality of semiconductor device packages 4 as shown in FIG. 4A.

As used herein, the singular terms "a," "an," and "the" may include plural referents unless the context clearly dictates otherwise.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, a first numerical value can be deemed to be "substantially" the same as a second numerical value if the first numerical value is within a range of variation of less than or equal to ±10% of the second numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations do not limit the present disclosure. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A singulated semiconductor device package, comprising:
   a carrier having a through hole;
   a lid over the carrier, the lid comprising a first side wall, a second side wall opposite the first side wall, and a connection wall extending between the first side wall and the second side wall, the lid and the carrier forming a plurality of chambers, the first side wall, the second side wall and the connection wall forming a space to fluidly connect the plurality of chambers; and
   an electronic component in one of the plurality of chambers, wherein the electronic component is laterally separated from the through hole by a distance;
   wherein the through hole is configured to expel air or fluid from at least one of the plurality of chambers to an environment during an operation of the singulated semiconductor device package.

2. The singulated semiconductor device package of claim 1, wherein the connection wall has a first height and the first side wall has a second height, and the first height is substantially the same as the second height.

3. The singulated semiconductor device package of claim 1, wherein the plurality of chambers are fluidly in communication with an environment outside the semiconductor device package through the through hole.

4. The singulated semiconductor device package of claim 1, further comprising an adhesive disposed between the carrier and a bottom of each of the first and second side walls.

5. The singulated semiconductor device package of claim 1, further comprising a top plate over the first side wall, the second side wall and the connection wall, wherein the space is between the connection wall and the top plate.

6. The singulated semiconductor device package of claim 5, further comprising an adhesive between the connection wall and the carrier.

7. The singulated semiconductor device package of claim 5, further comprising an adhesive disposed between the top plate and the first side wall and the second side wall.

8. The singulated semiconductor device package of claim 1, further comprising a third side wall extending between the first side wall and the second side wall, wherein the through hole is spaced away from a bottom of the third side wall over the carrier by a distance (D1).

9. The singulated semiconductor device package of claim 1, wherein the through hole has a width from approximately 80 μm to approximately 200 μm.

10. The singulated semiconductor device package of claim 1, wherein the through hole is spaced away from a bottom of the connection wall over the carrier by a distance (D2).

11. The singulated semiconductor device package of claim 1, wherein the carrier and a bottom of the connection wall define a space that is in communication with at least two adjacent ones of the plurality of chambers.

12. The singulated semiconductor device package of claim 11, wherein the space is in communication with the through hole via at least one of the plurality of chambers.

13. A singulated semiconductor device package, comprising:
   a carrier having a through hole;
   a lid over the carrier, the lid comprising:
      a first side wall;
      a second side wall opposite the first side wall;
      a third side wall extending between the first side wall and the second side wall;
      a fourth side wall opposite the third side wall and extending between the first side wall and the second side wall; and
      a connection wall disposed between the third side wall and the fourth side wall and extending between the first side wall and the second side wall, wherein the first side wall, the second side wall, the third side wall, the connection wall, and the carrier form a first chamber, the first side wall, the second side wall, the fourth side wall, the connection wall, and the carrier form a second chamber, the first side wall, the second side wall and the connection wall form a space to fluidly connect the first chamber and the second chamber;
   a first electronic component in the first chamber; and
   a second electronic component in the second chamber;
   wherein the first electronic component is laterally separated from the through hole by a distance, and the through hole is configured to expel air or fluid from at least one of the first chamber or the second chamber to an environment during an operation of the singulated semiconductor device package.

14. The singulated semiconductor device package of claim 13, further comprising a transparent plate over the first side wall, the second side wall, the third side wall, the fourth side wall, and the connection wall, wherein the space is between the connection wall and the transparent plate.

15. The singulated semiconductor device package of claim 14, further comprising an adhesive between the connection wall and the carrier.

16. The singulated semiconductor device package of claim 14, further comprising an adhesive disposed between the transparent plate and the first side wall, the second side wall, the third side wall, and the fourth side wall.

17. The singulated semiconductor device package of claim 13, wherein the through hole is away from a bottom of the third side wall over the carrier by a distance (D1).

18. The singulated semiconductor device package of claim 13, wherein the connection wall has a first height and the first side wall has a second height, and the first height is substantially the same as the second height.

19. The singulated semiconductor device package of claim 13, wherein the through hole is spaced away from a bottom of the connection wall over the carrier by a distance (D2).

20. The singulated semiconductor device package of claim 13, wherein the first chamber and the second chamber are fluidly in communication with an environment outside the semiconductor device package through the through hole.

21. A singulated semiconductor device package, comprising:
   a carrier having a through hole;
   a lid over the carrier, the lid comprising a first side wall, a second side wall opposite the first side wall, and a connection wall extending between the first side wall and the second side wall, wherein the lid and the carrier form a first chamber and a second chamber separated from the first chamber by the connection wall, and the through hole extends into the first chamber;
   a first electronic component in the first chamber; and
   a second electronic component in the second chamber,
   wherein the first side wall, the second side wall and the connection wall form a space to fluidly connect the first chamber and the second chamber; and
   wherein the first electronic component is laterally separated from the through hole by a distance, and the through hole is configured to expel air or fluid from at least one of the first chamber or the second chamber to an environment during an operation of the singulated semiconductor device package.

22. The singulated semiconductor device package of claim 21, further comprising a transparent plate over the first side wall, the second side wall and the connection wall, wherein the space is between the connection wall and the transparent plate.

23. The singulated semiconductor device package of claim 21, wherein the first chamber and the second chamber are fluidly in communication with an environment outside the semiconductor device package through the through hole.

* * * * *